US011532629B1

(12) United States Patent
Mahalingam

(10) Patent No.: US 11,532,629 B1
(45) Date of Patent: Dec. 20, 2022

(54) BENT GATE LOGIC DEVICE

(71) Applicant: Texas Instruments Incorporated, Dallas, TX (US)

(72) Inventor: Nandakumar Mahalingam, Richardson, TX (US)

(73) Assignee: Texas Instmments Incorporated, Dallas, TX (US)

(*) Notice: Subject to any disclaimer, the term of this patent is extended or adjusted under 35 U.S.C. 154(b) by 0 days.

(21) Appl. No.: 17/348,173

(22) Filed: Jun. 15, 2021

(51) Int. Cl.
| | |
|---|---|
| *H01L 21/00* | (2006.01) |
| *H01L 27/092* | (2006.01) |
| *H03K 19/0948* | (2006.01) |
| *H01L 27/088* | (2006.01) |
| *H01L 29/78* | (2006.01) |
| *H01L 21/265* | (2006.01) |
| *H01L 29/66* | (2006.01) |
| *H01L 21/8238* | (2006.01) |
| *H01L 21/266* | (2006.01) |

(52) U.S. Cl.
CPC .... *H01L 27/0928* (2013.01); *H01L 21/26586* (2013.01); *H01L 27/088* (2013.01); *H01L 29/66492* (2013.01); *H01L 29/7836* (2013.01); *H03K 19/0948* (2013.01); *H01L 21/266* (2013.01); *H01L 21/26513* (2013.01); *H01L 21/82385* (2013.01)

(58) Field of Classification Search
CPC ........... H01L 27/0928; H01L 21/26586; H01L 27/088; H01L 29/66492; H01L 29/7836; H01L 21/26513; H01L 21/266; H01L 21/82385; H03K 19/0948
See application file for complete search history.

(56) References Cited

U.S. PATENT DOCUMENTS

| | | | |
|---|---|---|---|
| 7,301,182 B1 | 11/2007 | Metzger et al. | |
| 8,216,903 B2* | 7/2012 | Houston | H01L 29/1083 438/290 |
| 8,753,944 B2 | 6/2014 | Nandakumar et al. | |
| 8,859,380 B2* | 10/2014 | Wu | H01L 29/66492 438/302 |
| 2015/0200272 A1* | 7/2015 | Liu | H01L 29/7833 438/289 |

* cited by examiner

*Primary Examiner* — Richard A Booth
(74) *Attorney, Agent, or Firm* — Andrew R. Ralston; Charles A. Brill; Frank D. Cimino

(57) ABSTRACT

An IC includes a first and second active areas (AA) with a second conductivity type, a source and drain region, and an LDD extension to the source and drain in the first AA having a first conductivity type. A first bent-gate transistor includes a first gate electrode over the first AA extending over the corresponding LDD. The first gate electrode includes an angled portion that crosses the first AA at an angle of 45° to 80°. A second transistor includes a second gate electrode over the second AA extending over the corresponding LDD including a second gate electrode that can cross an edge of the second AA at an angle of about 90°. A first pocket distribution of the second conductivity type provides a pocket region under the first gate electrode. A threshold voltage of the first bent-gate transistor is ≥30 mV lower as compared to the second transistor.

12 Claims, 6 Drawing Sheets

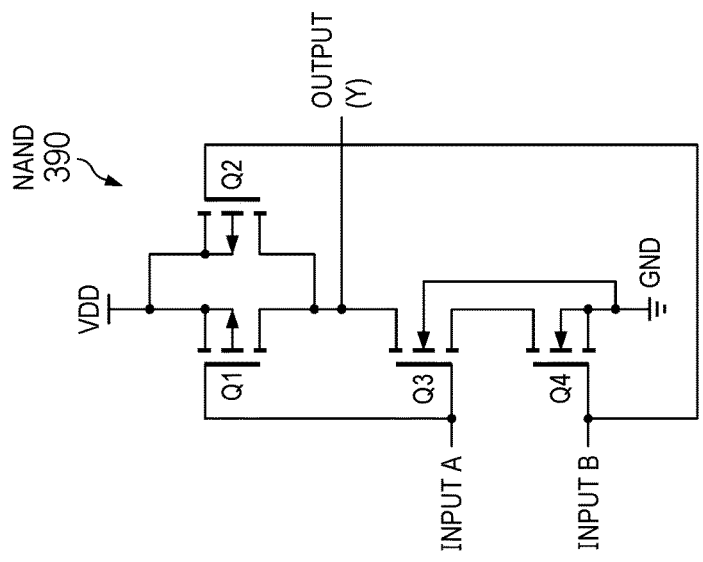
FIG. 3B
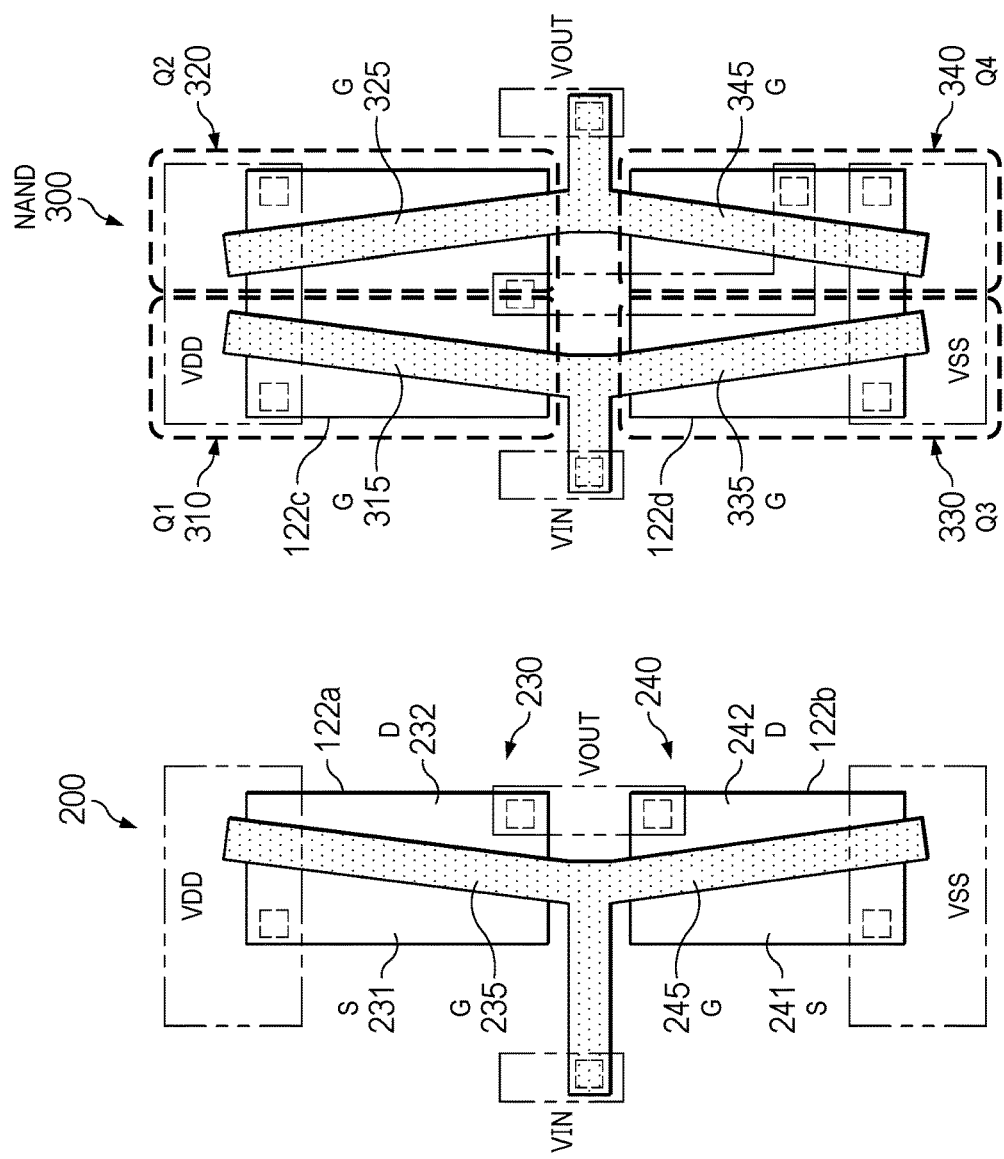
FIG. 3A
FIG. 2

BENT GATE LOGIC DEVICE

CROSS-REFERENCE TO RELATED APPLICATIONS

This application is related to application Ser. No. 17/135,541 ("the '541 application") that was filed Dec. 28, 2020, which is incorporated herein by reference in its entirety.

FIELD

This Disclosure relates to the field of semiconductor devices, and more particularly to bent-gate transistors.

BACKGROUND

Some integrated circuits (ICs) may include both higher voltage transistors, such as double-diffused metal oxide semiconductor (DMOS) power transistors, as well as higher performance "core" transistors that are designed for higher speed and lower power. For example, for BiCMOS technologies, one specific example is for a linear bipolar process.

Higher performance for core transistors can be obtained by gate length (L) scaling to a shorter L to lower the gate capacitance and to increase the drive current of the transistor. However, the increase in performance resulting from gate length scaling is limited by two factors being (1) an increase in variability at a shorter L resulting in a lower weak corner drive current, and (2) degradation in hot carrier reliability which degrades the end of life performance of the transistor. To overcome these issues significant process modifications including one or more additional mask levels are needed which tend to increase the cost of the process. An alternative method to improve the performance of core transistors is to lower the threshold voltage selectively by implantation using additional masks. However, the implantation method is also expensive.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects include an integrated circuit (IC) comprising a substrate having a first active area and a second active area both with a second conductivity type. A source region and a drain region and a lightly doped drain (LDD) extension to the source region and drain region in the first active area have a first conductivity type. A source region and a drain region and a LDD extension to the source region and drain region in the second active area also have the first conductivity type. Each of the first and second active areas have a first side and an opposing second side. A first bent-gate transistor includes a first gate electrode over the first active area extending over the respective LDD extension, the first gate electrode including an angled portion that crosses the first active area between the first and second sides at a gate angle of 10° to 45° relative to the first side of the first active area.

A second transistor includes a second gate electrode over the second active area extending over the respective LDD extension. The second gate electrode crosses the second active area between the first and second sides of the second active area at a gate angle of about 0° relative to the first side of the second active area. As used herein any time an angular measure is quoted as being 'about' a certain number of degrees, unless specified otherwise herein, where the term allows ±10% deviation from the stated nominal value. A first pocket distribution of the second conductivity type provides a pocket region at least in part under the first gate electrode. A threshold voltage magnitude of the first bent-gate transistor is at least 30 mV lower as compared to the second transistor, such as at least 100 mV lower. A retrograde gate-edge diode leakage (GDL) reduction region of the first conductivity type is within the pocket region and between the LDD extension of the first transistor and the first active area, the retrograde GDL reduction region including a dopant of the first conductivity type and a dopant of the second conductivity type.

Disclosed aspects include a method of forming an IC comprising forming an active area in a semiconductor substrate, the active area including a doped region having a first conductivity type surrounded by and touching a dielectric isolation structure, the doped region having a first side and an opposite second side. A gate electrode that can comprise polysilicon is formed over the active area, the gate electrode having an angled portion that crosses an edge of the first active area at a gate angle of at least 10° relative to the first and second sides. An LDD region is formed in the active area adjacent to and extending under the gate electrode. The forming of the LDD region comprises performing a first pocket implant of a first dopant of the first conductivity type using a masking pattern, the first pocket implant having a first twist angle, and performing a second pocket implant of a second dopant of a second conductivity type using the masking pattern, the second implant having a second twist angle. The second twist angle is different from the first twist angle by between 5 degrees and 90 degrees.

Disclosed aspects also include an IC that includes a first and second active area with a second conductivity type, corresponding source and drain regions and corresponding LDD extensions to the source and drain regions having a first conductivity type. A first bent-gate transistor includes a first gate electrode over the first active area extending over the corresponding LDD extension, the gate electrode including an angled portion that crosses an edge of the first active area at an angle of 45° to 80°. A second transistor includes a second gate electrode over the second active area extending over the corresponding LDD extension and including a second gate electrode that crosses an edge of the second active area with a relative angle of about 90°. A first pocket distribution of the second conductivity type provides a pocket region under the first gate electrode. A threshold voltage magnitude of the first bent-gate transistor is at least 30 mV lower than the threshold voltage magnitude of the second transistor. A retrograde GDL reduction region of the first conductivity type is within the pocket region and between the LDD and the first active area including a first and second conductivity type.

BRIEF DESCRIPTION OF THE DRAWINGS

Reference will now be made to the accompanying drawings, which are not necessarily drawn to scale, wherein:

FIG. 2 is a top-view depiction of a first bent-gate transistor in a first active area and second bent-gate transistor in a second active area connected to one another in series including their gates being common (generally connected by a metal layer) to implement a bent-gate CMOS inverter.

FIG. 3A is a top-view depiction of a bent-gate CMOS NAND gate, with FIG. 3B showing its equivalent circuit, each having two inputs, according to an example aspect. As shown by example in FIG. 3B, Q1 is shown as a PMOS transistor, Q2 as an NMOS transistor, and Q3 and Q4 as an NMOS transistor.

FIG. 4A shows Idrive with increasing gate angle; FIG. 4B shows the threshold voltage ($V_T$) with increasing gate angle; and FIG. 4C shows the log(Ioff) vs. drive current Ids.

DETAILED DESCRIPTION

Figure 1A:
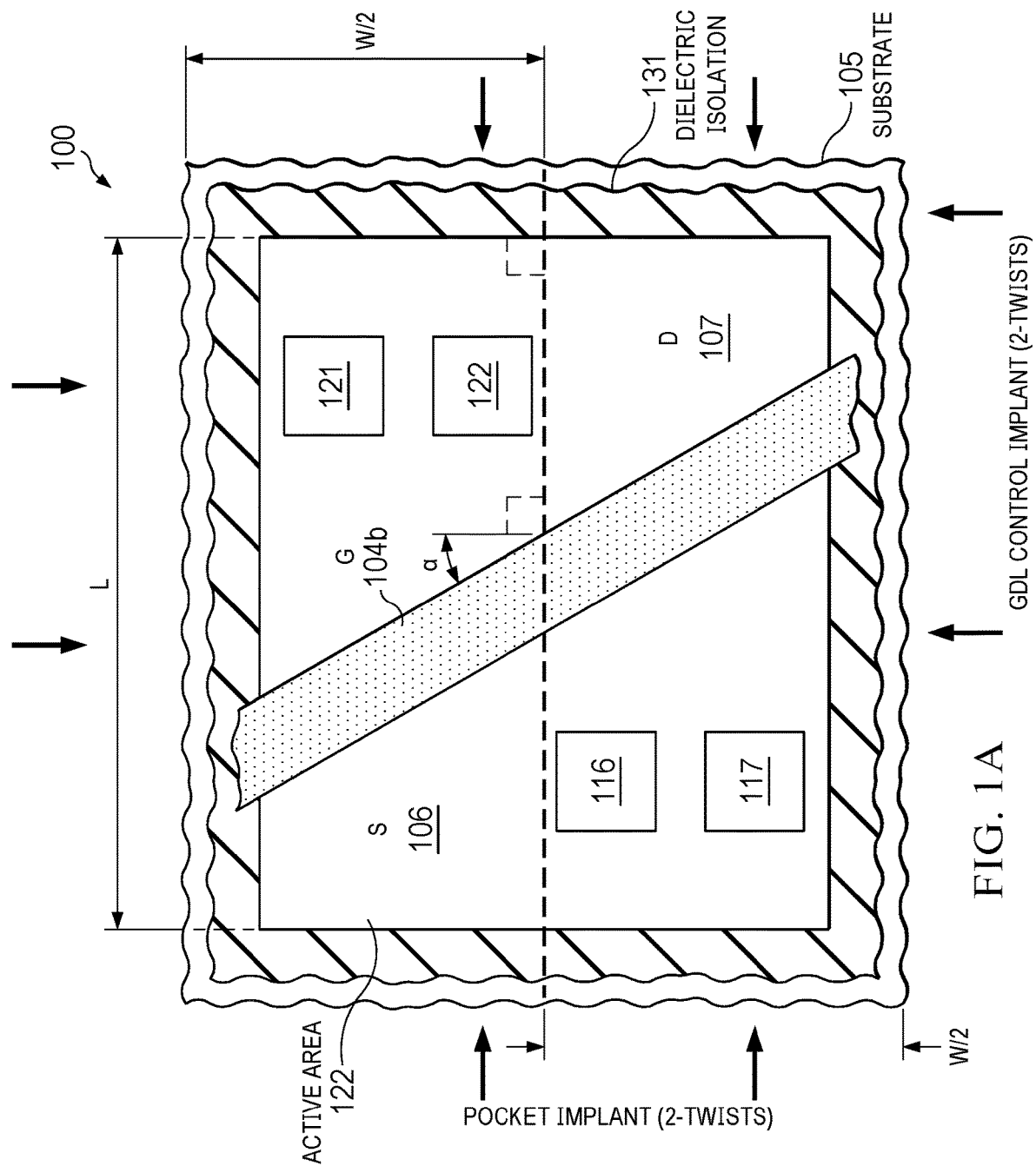
FIG. 1A is a top-view depiction of an example bent-gate transistor, according to an example aspect.

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "connected to" or "connected with" (and the like) as used herein without further qualification are intended to describe either an indirect or direct electrical connection. Thus, if a first device "connects" to a second device, that connection can be through a direct electrical connection where there are only parasitics in the pathway, or through an indirect electrical connection via intervening items including other devices and connections. For indirect connections, the intervening item generally does not modify the information of a signal but may adjust its current level, voltage level, and/or power level.

As used herein a pocket implant, also known as a halo implant, is of the same dopant type as the channel (P-type for NMOS, N-type for PMOS) and may be implanted self-aligned to the gate. This implant reduces parametric dependence on variation of the gate length and reduces short channel effects. Also, as used herein a GDL control implant is of an opposite dopant type to channel (N-type for PMOS and P-type for NMOS). A GDL control implant may be implanted at a shallow angle adjacent to the gate using a relatively heavy ion species such as arsenic, antimony or indium, and can also be used to minimize impact to the channel doping while still lowering the local electric field and GDL leakage.

As used herein the term active area (sometimes also called an active region) is defined as the top part of the IC die that comprises a semiconductor material such as silicon, where the active area is generally framed by an isolation structure, such as by a trench isolation dielectric material. The active area may contain the layers of the transistors, resistors and interconnection layers that make up the circuits and perform the actual function for the IC die.

Figure 1B:
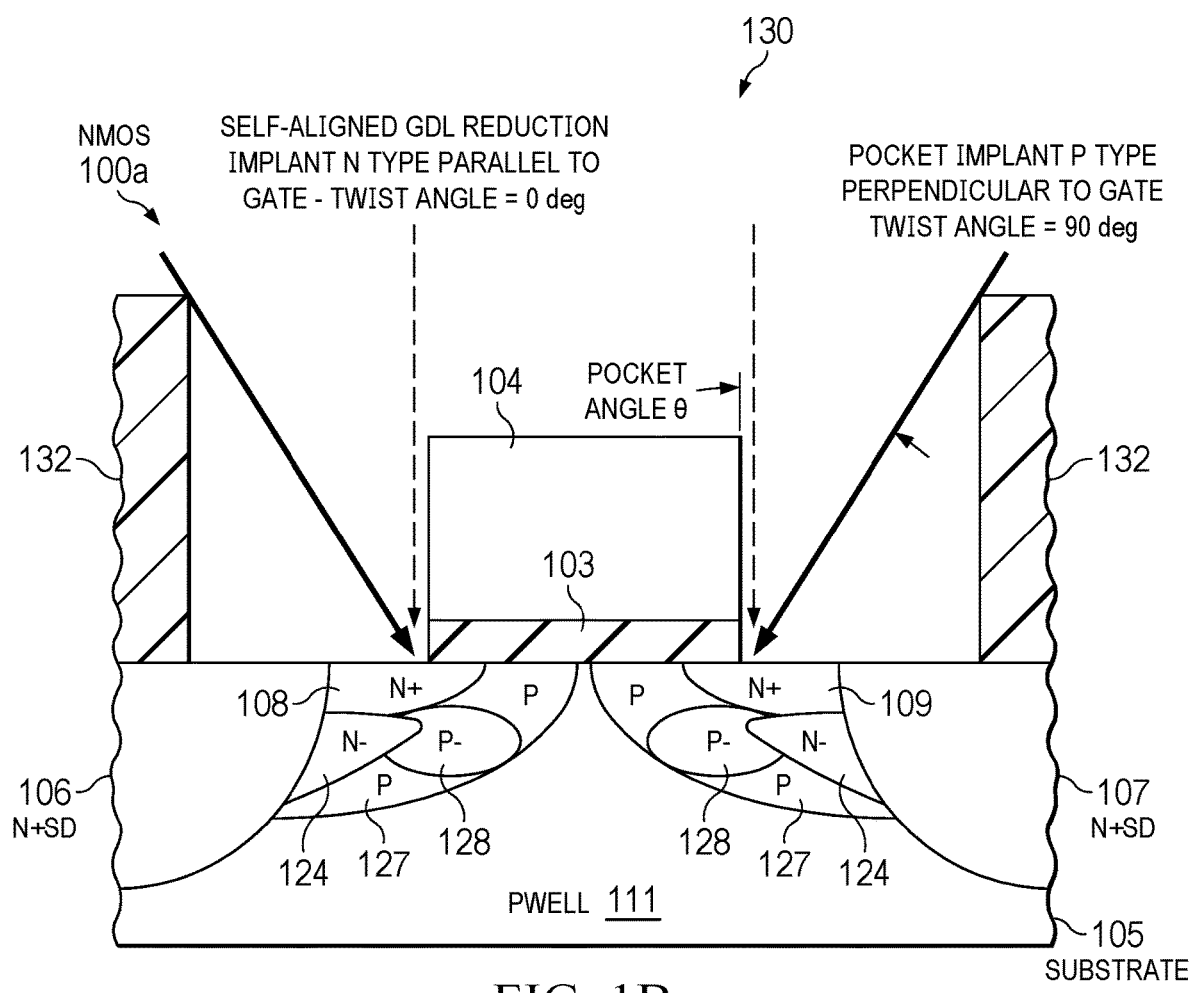
FIG. 1B is a cross-section view showing an IC including a standard transistor with a Manhattan gate geometry that received a two-twist pocket implant and a two-twist GDL control implant.
Figure 1C:
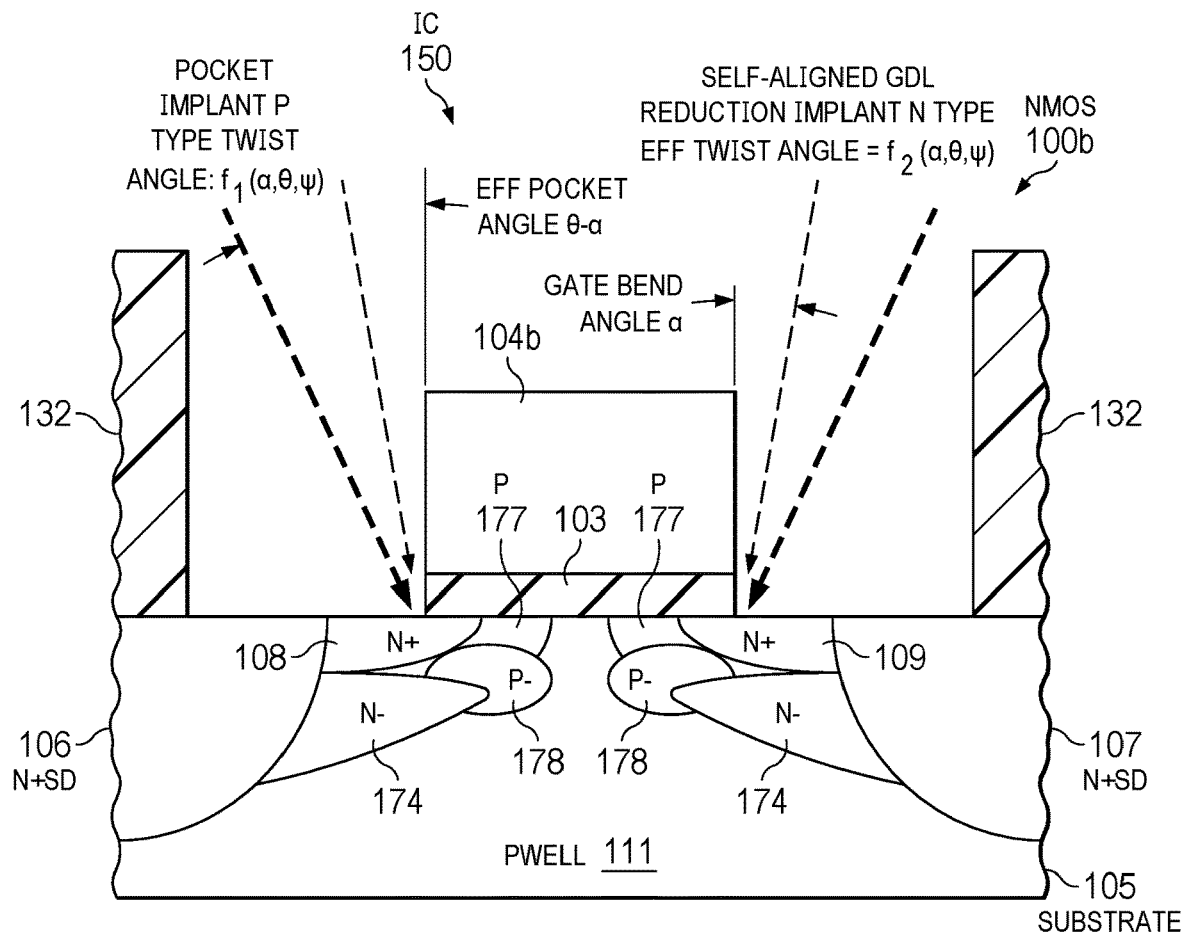
FIG. 1C is a cross-sectional view showing an IC including a disclosed NMOS bent-gate transistor that includes a bent-gate and a pocket region resulting from a disclosed two-twist pocket implant and a GDL control region resulting from a disclosed two-twist GDL control implant.
Figure 1D:
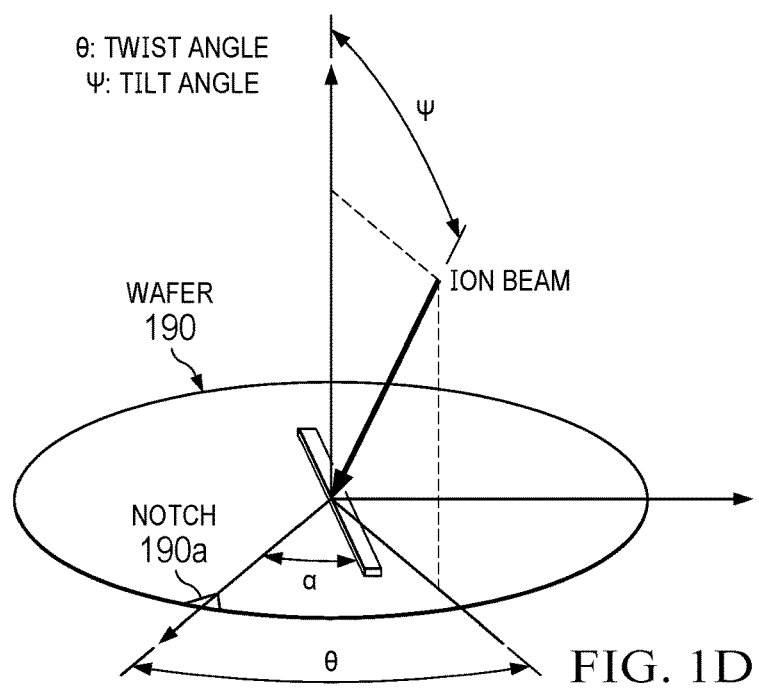
FIG. 1D shows what constitutes the twist angle shown as θ and what constitutes the tilt angle shown ψ for an ion implant applied to semiconductor die on the wafer.

As used herein the term implant twist angle shown for the wafer 190 shown in FIG. 1D as θ is defined as the angle between an axis from a wafer center to a notch (or flat) shown on the wafer bottom and the projection vector of an ion beam on the surface of the wafer for FETs under the ion beam.

Core transistors of an IC design can comprise MOS transistors known as bent-gate transistors. Bent-gate transistors are designed with a gate that does not pass straight through the active area of the transistor, but instead take a longer angled path through the active area. Bent-gate transistors provide a greater total width of the gate within the transistor as compared to a gate that is cut straight through the transistor, thus providing higher drive current.

Because in disclosed aspects a 2-twist angle pocket implant is used, the amount of pocket doping in the bent-gate device will result in being lower leading to higher current drive and higher performance without higher variability when compared to a 2-twist angle GDL control implants used for a Manhattan gate device which are in the baseline process used for comparison herein. Disclosed aspects corresponding to this application described above are compared to the devices and methods disclosed in the '541 application, that are referred to herein as a "baseline". Two-disclosed 2-twist angle pocket implants function to further counter-dope the pocket regions in the bent-gate transistors leading to a lower magnitude of the $V_T$, higher drive current and a further increase in performance. The bent-gate logic devices can be interspersed with standard logic devices in an IC design to enable trading off performance and power as desired.

FIG. 1A is a top-view depiction of an example bent-gate transistor 100, according to an example aspect. An IC utilizing disclosed aspects will typically have both Manhattan gate transistors and bent-gate transistors, where the bent-gate transistors provide a $V_T$ at least 30 mV less than the $V_T$ of the Manhattan gate transistor on the same IC.

The bent-gate transistor 100 is shown comprising an active area 122 shown with a rectangular shape as an example framed by a dielectric isolation 131 that electrically isolates the bent-gate transistor 100 in the case of an IC from other transistors on the same IC. The active area 122 is shown having a length shown as L and a width shown as W.

The dielectric isolation 131 can comprise shallow trench isolation (STI), or local oxidation of silicon (LOCOS). The bent-gate transistor 100 comprises a bent gate 104b having a gate length perpendicular to the long axis of the gate, and the bent gate 104b is shown by example being angled with an angle about 45° relative to L and to W. A gate angle "α" characterizes the angle between the bent gate 104b and an axis perpendicular to the side or sides of the active area 122 crossed by the bent gate 104b. In various examples the bent gate 104b crosses an edge of the first active area at an angle relative to that edge that is in the range of 45° to 80°, such as 60° to 80°, corresponding to the gate angle α being in a range from 10° to 30°. The bent gate 104b is on a gate dielectric layer (not shown, but see the gate dielectric layer 103 shown in FIG. 1C described below).

Within the active area 122 there is a source 106, a drain 107, metal filled contacts 116, 117 for connecting to the source 106 that are generally formed through a dielectric layer such as a pre-metal dielectric (PMD) on the top surface of the substrate. Metal filled contacts 121, 122 are similarly formed for connecting to the drain 107. Although two contacts are shown for the respective source and drain terminals, for each of these terminals there can be any number of contacts consistent with applicable design rules.

The bent-gate transistor 100 can comprise a PMOS transistor or an NMOS transistor. Also shown by arrows is a 2-rotation twist (also known as rotation) pocket implant (also known as a halo implant) and a 2-twist GDL control implant, depicted by example with the pocket and GDL control implants being implanted orthogonal (perpendicular) to one another, meaning the pocket implants and the GDL control implants are implemented by implants having twists which are orthogonal (or perpendicular), or close to being orthogonal.

The degree of the bend in the bent gate 104b with respect to the active area 122, shown in FIG. 1A as α, is generally 10 to 45 degrees with respect to the axis parallel to the sides of the active area 122, e.g. parallel to the direction of the GDL control implants with respect to the direction of their projections on the surface of the substrate 105. Thus the bent gate 104b crosses a side of the active area at an angle in a range between 45° and 80°, e.g. 90°-α. If α is too small the $V_T$ will be too high (not be low enough) and performance may not improve as compared to a Manhattan gate transistor. If α is too high, the $V_T$ may be too low and the transistor leakage may be too high and short channel effects may make the transistor uncontrollable. The $V_T$ for the bent-gate transistor 100 is at least 30 mV lower than the $V_T$ for an otherwise equivalent MOS transistor with a Manhattan gate. The difference between the $V_T$ of the transistor 100 and the $V_T$ of a transistor based on a Manhattan gate layout range can be in a range between 50 mV and 300 mV.

FIG. 1B is a cross-section view showing an IC 130 including a baseline NMOS transistor 100a with a Manhattan gate geometry that received a two-twist pocket implant and a two-twist GDL control implant. A Manhattan gate geometry means the gates and active regions are oriented at 0° or 90° with respect to the notch on the wafer (e.g. at the bottom of wafer) for a 200 mm or a 300 mm wafer, or a flat on the wafer for smaller wafer diameters instead. The location of the notch or flat may identify the crystal orientation of the wafer.

The NMOS transistor 100a includes a source region 106 and a drain region 107, and an LDD structure including a first pocket distribution of p-type dopant providing a source extension (lightly doped drain, or LDD) 108 and drain extensions, or LDD, 109, first pocket regions 127 shown extending to the surface of the pwell 111 under the gate dielectric layer 103. NMOS transistor 110 also includes at least one retrograde GDL reduction distribution of n-type dopant providing retrograde GDL reduction pocket regions. The GDL reduction pocket regions are provided by the GDL reduction implant through an opening in a masking pattern 132, e.g. patterned photoresist.

The retrograde GDL reduction pocket regions include an overlap with the first pocket regions 127 to form a first doped pocket portion shown as p⁻ doped pocket portion 128 and n⁻ doped pocket portion 124. N⁻ doped pocket portion 124 is shown dopant type inverted, where a concentration of the n-type dopant type exceeds the concentration p-type dopant provided by first pocket regions 127 plus the pwell 111. N⁻ doped pocket portion 124 provides one side and p⁻ doped pocket portion 128 the other side of the buried n⁻/p⁻ regions shown in FIG. 1A. The pocket portions are provided by the pocket implant through the opening in a masking pattern 132.

FIG. 1C is a cross-sectional view showing an IC 150 including a disclosed NMOS bent-gate transistor 100b that includes a bent-gate 104b and a pocket region resulting from a disclosed two-twist pocket implant and a GDL control region resulting from a disclosed two-twist GDL control implant. The NMOS transistor 100b includes source region 106 and drain region 107, and an LDD structure including a first pocket distribution of p-type dopant providing a first pocket regions 177 shown extending to and intersecting the surface of the pwell 111 and the substrate 105 under the gate dielectric layer 103. Source and drain extensions 106, 107 also extend to and intersect the top surface of the substrate 105. NMOS transistor 100b also includes at least one retrograde GDL reduction distribution of n-type dopant providing retrograde GDL reduction pocket regions.

Regarding the bent-gate angle α, the pocket twist angle is perpendicular (90 deg) to the portion of the gate of the standard (non-bent) transistor gate facing the contacts (which as shown in FIG. 1A are on the source-drain regions), while the GDL control implant twist angle is parallel (0 deg) to the portion of the standard transistor gate facing the contact. When one bends the gate by the angle α to provide a bent-gate transistor, the effective pocket twist angle decreases by a function of α, while the GDL control implant twist angle increases by a function of α. This results in less p-type pocket dopant and more n-type GDL control implant dopant in the bent-gate transistor channel which lowers the $V_T$ and improves performance, The retrograde GDL reduction pocket regions include an overlap with the first pocket regions 177 to form a first doped pocket portion shown as p⁻ doped pocket portion 178 and n⁻ doped pocket portion 174. N⁻ doped pocket portion 174 is shown dopant type inverted, where a concentration of the n-type dopant type exceeds the concentration p-type dopant provided by first pocket regions 177 plus the pwell 111. N⁻ doped pocket portion 174 provides one side and p⁻ doped pocket portion 178 the other side of the buried n⁻/p⁻ regions shown in FIG. 1A. In general, the pocket portions 177 and 178 are more lightly doped than the pocket portions 127 and 128, while the pocket portion 174 is doped more heavily than the pocket portion 124. In some cases the pocket portion 178 may be about neutrally doped.

FIG. 1D shows what constitutes the twist angle shown as θ and what constitutes the tilt angle shown ψ for an ion implant applied to semiconductor die on the wafer shown as 190. Thee notch on the wafer is shown as 190a. A representative unreferenced gate electrode has the angle α relative to the axis from the wafer's center to the notch.

FIG. 2 is a top-view depiction of a bent-gate CMOS inverter 200 comprising a first bent-gate transistor 230 in a first active area 122a and second bent-gate transistor 240 in a second active area 122b, with the bent-gate transistors connected to one another in series including their gates being common to implement the bent-gate CMOS inverter 200, according to an example aspect. The bent-gate CMOS inverter 200 includes the first bent-gate transistor 230 as a PMOS transistor comprising a bent gate 235, a drain 232 and a source 231, and the second bent-gate transistor 240 comprising a NMOS transistor comprising a bent gate 245, a drain 242 and a source 241.

These respective bent-gate transistors 230, 240 are connected at the drain 232, 242 and at the gate 235, 245. In operation of the bent-gate CMOS inverter 200 a supply voltage shown as VDD is applied at the source 231 of the first bent-gate transistor 230, and a ground is connected to the source 241 of the second bent-gate transistor 240. VIN is connected to the gate terminals 235, 245, and VOUT is connected to the drain terminals 232, 242. Both bent gates 235 and 245 have an example angle difference of about 12°.

Although both the bent-gate CMOS inverter 200 includes both transistors shown as bent-gate transistors 230, one of the bent-gate transistors 230, 240 can utilize a non-bent gate, e.g. Manhattan geometry. The bent-gate CMOS inverter 200 has been found by simulation to provide a 15 to 20% performance improvement as compared to an otherwise baseline CMOS inverter with the differences being different pocket and GDL control implants as described above and with bent gates as compared to with a Manhattan gate geometry.

FIG. 3A is a top-view depiction of a bent-gate CMOS NAND gate 300 and its equivalent circuit shown in FIG. 3B as 390, each having two inputs, according to an example aspect. For equivalent NAND gate circuit 390 Q1 is shown as a PMOS transistor, Q2 is shown as an NMOS transistor, and Q3 and Q4 are both shown as NMOS transistors.

Bent-gate CMOS NAND gate 300 shown in FIG. 3A comprises four bent-gate transistors shown as a first bent-gate transistor Q1 310 including a gate 315, source 311 and drain 312, a second bent-gate transistor Q2 320 including a gate 325, source 321 and drain 322 both within active area 122c, and a third bent-gate transistor Q3 330 including a gate 335, source 331 and drain 333, and a fourth bent-gate transistor Q4 340 comprising a gate 345, a source 341 and a drain 342 and a second active area 122d. The respective bent-gate transistors 310, 320, 330 and 340 are connected to one another to implement the bent-gate CMOS NAND gate 300, where the source is connected to the drain of the first and second bent-gate transistors 310, 320 (sharing active area 122c) an analogous connection for the third and fourth bent-gate transistors 330, 340. All the pairs of gates 315 and 325, and 335 and 345 have an angle between the pairs of gates 315/325 and 335/345 of 12°.

The bent-gate CMOS NAND gate 300 has been found by simulation to provide a 15 to 20% performance improvement as compared to the above-described baseline CMOS NAND gate with a Manhattan geometry (as noted above receives standard pocket and GDL control implants standard pocket and GDL control implants with no bent-gates.

FIG. 3B shows the equivalent NAND gate circuit 390 comprises two series NMOS transistors shown as Q3 and Q4 between a node identified as the output (Y) and ground and two parallel PMOS transistors shown as Q1 and Q2 between the output Y and VDD. In operation when the output Y will be high, if both inputs are high, both of the NMOS transistors Q3 and Q4 will be ON and both of the PMOS transistors Q1 and Q2 will be OFF. Hence, the output (Y) will be logic low. If either input A or input B is logic 0, at least one of the NMOS transistors Q3 and Q4 will be OFF, breaking the path from Y to Ground. But at least one of the PMOS transistors Q1 and Q2 will be ON, creating a path from Y to VDD.

There can be NMOS transistors with bent gates in the NAND gate for example to improve performance without increasing leakage since NMOS transistors are in series. However, the PMOS transistor on the same IC can have the standard Manhattan gate orientation to limit leakage including Ioff. The same applies for other logic gates, such as a NOR gate.

An example fabrication method will now be described to form an IC including one or more bent-gate MOS transistors, such as the NMOS transistor 100 shown in FIG. 1A or the NMOS transistor 100b shown in FIG. 1C. NMOS transistor 100b is generally formed by masked implantation into the LDD region with a pocket implant with a tilt angle and two (dual) twists, and optionally a dual-twist GDL control implant with a tilt angle. Although fabrication of a bent-gate NMOS transistor is described below, as described above the same IC may also contain a disclosed PMOS bent-gate transistor, and also a combination of both disclosed bent-gate devices and Manhattan gate devices as well.

The IC comprises a substrate 105 having a substrate surface which can be a single-crystal silicon substrate doped n-type. However, the substrate 105 may also be doped p-type, or may be an epitaxial (e.g., silicon) layer on a single-crystal substrate.

The NMOS transistor 100b is formed in a pwell 111 that is implanted and/or diffused into the substrate 105 surface. A gate stack comprising gate dielectric layer 103 with a bent gate 104b as a gate electrode thereon is then formed on the top surface of the pwell 111. The NMOS transistor 100b also includes an N+ doped source 106, and an N+ doped drain 107, that are both generally implanted regions.

The gate dielectric layer 103 can comprise silicon oxide, nitrogen doped silicon dioxide, silicon oxy-nitride, hafnium oxide, layers of silicon dioxide and silicon nitride, or other electrically insulating material, such as being 1 to 3 nanometers thick. The bent gate 104b can comprise polycrystalline silicon doped n-type (or doped p-type for PMOS) with a silicide formed on top, or a metal or metal compound such as titanium, tungsten, TiN, tantalum, or TaN for replacement metal gate arrangements. In addition, the NMOS transistor 100b can have optional spacers on the sidewalls of the gate stack comprising the bent gate 104b, on gate dielectric layer 103. LDD extensions include a source extension (LDD) 108, and a drain extension (LDD) 109, both doped n-type for the NMOS transistor.

The NMOS transistor 100b is electrically insulated from other devices on the IC 150 including other active devices on the IC 150 by a dielectric isolation 131 (see FIG. 1A) such as STI formed within the substrate 105 surface. However, besides STI generally, any isolation structure may be used for the dielectric isolation 131, such as LOCOS or as an alternative to dielectric isolation 131, the isolation can also be junction isolation regions.

NMOS 100b includes a first pocket distribution of p-type dopant providing first pocket regions 177 shown extending to the surface of the pwell 111 under the gate dielectric layer 103. NMOS 100b also includes at least one retrograde GDL reduction distribution of n-type dopant providing retrograde GDL reduction pocket regions. The retrograde GDL reduction pocket regions include an overlap with the first pocket regions 177 to form a first doped pocket portion shown as p⁻ doped pocket portion 178 and n⁻ doped pocket portion 174. N⁻ doped pocket portion 174 is shown dopant type inverted, where a concentration of the n-type dopant type exceeds the concentration p-type dopant provided by first pocket regions 177 plus the pwell 111. N⁻ doped pocket portion 174 provides one side and p⁻ doped pocket portion 178 the other side of the buried n⁻/p⁻ regions shown in FIG. 1A.

The retrograde GDL reduction pocket regions 178 can be seen to create local regions of lower net doping and thus a lower electric field, thereby reducing the sub-surface band-to-band tunneling near the LDDs 108, 109 and the source 106 and drain 107 junctions, leading to a substantial reduction in the GDL. Additionally, the buried n⁻/p⁻ regions are localized below the LDD and source/drain junctions to not intrude into the channel region of the NMOS 100b, minimizing the impact to the $V_T$ and subthreshold (source) leakage of NMOS 100b. Due to the minimized $V_T$ impact, the on-state performance of NMOS transistor 100b is maintained while the total leakage of NMOS transistor 100b, which is a sum of the GDL, gate leakage and source leakage, is reduced.

EXAMPLES

Disclosed aspects are further illustrated by the following specific Examples, which should not be construed as limiting the scope or content of this Disclosure in any way.

Example implant conditions are provided below for both the pocket implants and the GDL control implant for both NMOS and PMOS transistors.

The first and second NMOS pocket implants comprise P type implants such as boron (energy 5-25 keV, with a total (combined) dose $5\times10^{12}$ cm$^{-2}$ to $5\times10^{13}$ cm$^{-2}$, a tilt angle 5 to 45 degrees, utilizing 2-twist angles, such as 0 deg and 180 deg, and in the case of indium and energy 15-50 keV, a dose $5\times10^{12}$ to $1\times10^{14}$ cm$^{-2}$, a tilt angle 5 to 45 deg, and 2-twist angles of 0 deg and 180 degrees.

For the NMOS transistor the optional GDL control implants can comprise one or more of N type implants such as arsenic, antimony or phosphorus with energy 15 keV to 50 keV, a dose $5\times10^{12}$ to $1\times10^{14}$ cm$^{-2}$, a tilt angle of 5 to 45 deg, and 2-twist angles of 90 deg and 270 deg.

In the case of a PMOS transistor, the pocket implant comprises one or more of N type species such as phosphorus, arsenic or antimony at an energy of 15 keV to 50 keV, a dose of $5\times10^{12}$ cm$^{-2}$ to $1\times10^{14}$ cm$^{-2}$, a tilt angle of 5 deg to 45 deg, and 2-twist angles 0 deg and 180 deg.

For the PMOS transistor the optional GDL control implant comprises one or more of P type implants such as indium or boron at an energy 5 keV to 50 keV, a dose of $5\times10^{12}$ to $1\times10^{14}$ cm$^{-2}$, tilt angles of 5 to 45 deg, and 2-twist angles of 90 degrees and 270 degrees.

Figure 4A:
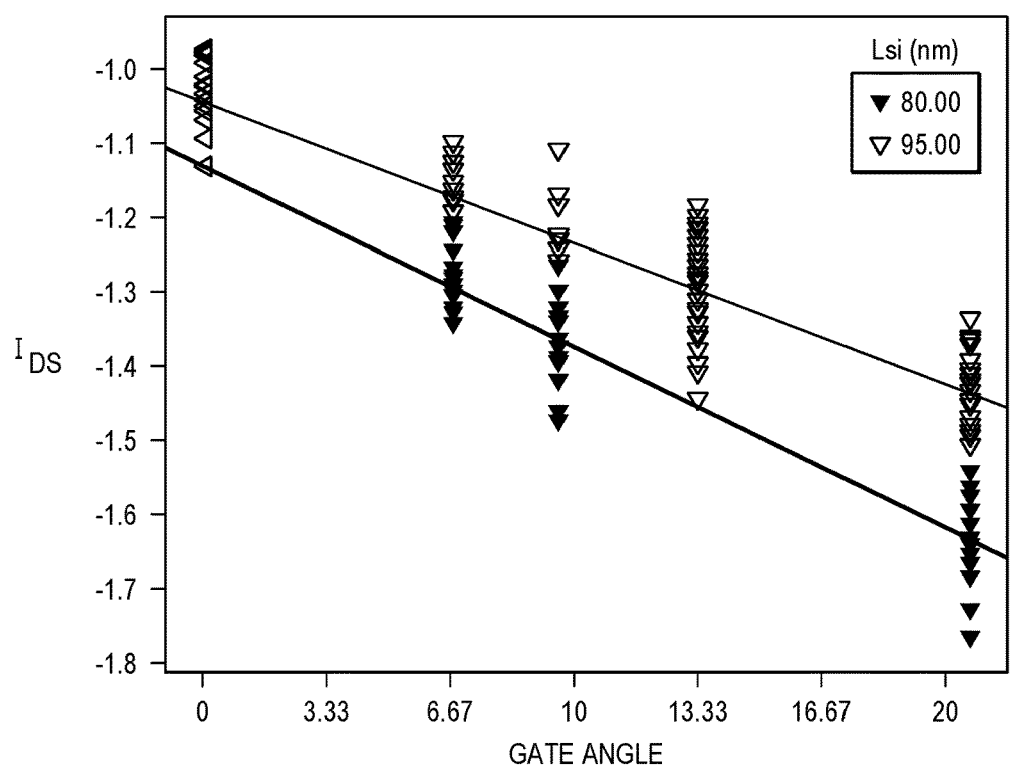
FIGS. 4A-4C show normalized experimental data for disclosed bent-gate PMOS transistors with two different gate lengths.
Figure 4B:
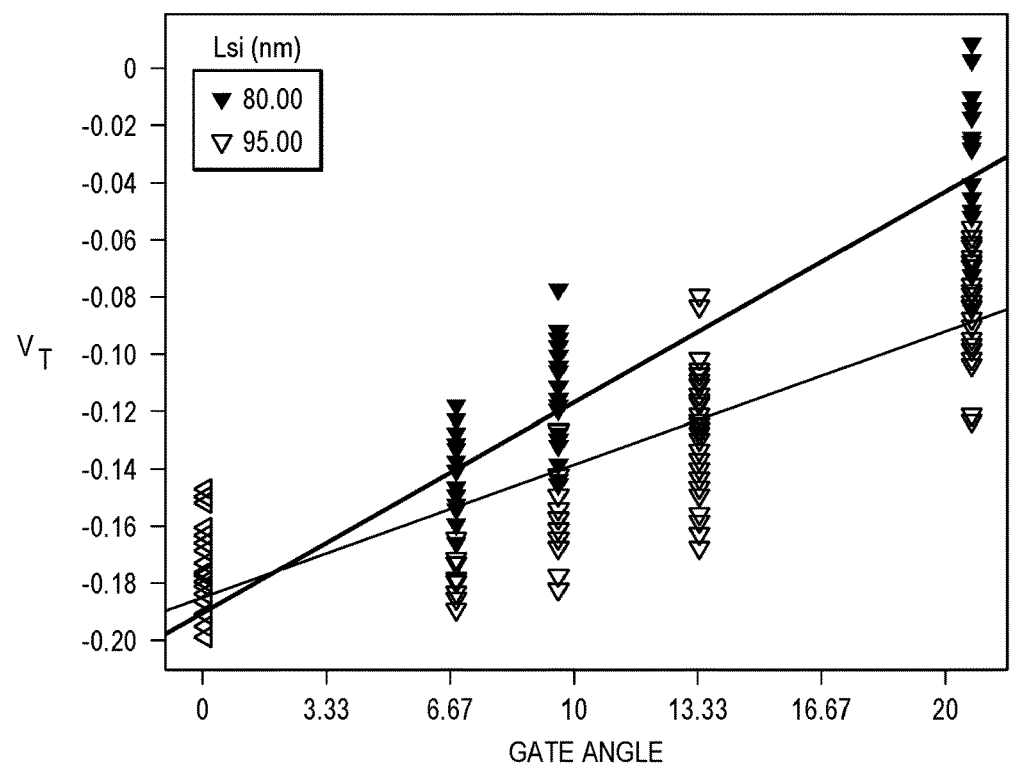
Figure 4C:
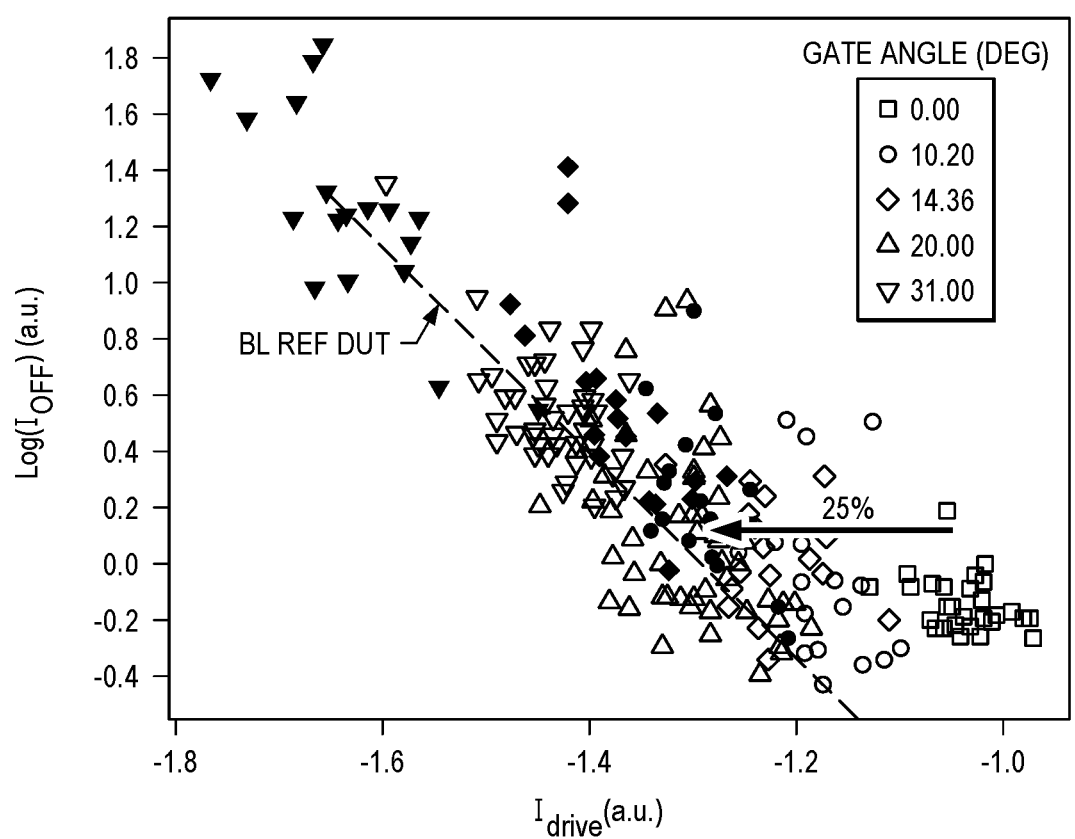

FIGS. 4A-4C show normalized data in arbitrary units (a.u.) for a disclosed bent-gate PMOS transistor as implemented on five different wafers and measured at multiple representative sites on each wafer. Two different gate lengths were characterized, being 80 nm and 95 nm. As shown in FIG. 4A, as the gate angle increases from 0° to 20°, the drive current increases about 50% for the 80 nm gate length and about 45% for the 95 nm gate length transistor.

FIG. 4B shows that as the gate angle increase from 0° to 20°, the $V_T$ drops about 25% for the 80 nm gate length transistors, and about 20% for the 95 nm gate length transistors. FIG. 4C is a log-linear plot of off-current vs. drive current, and shows similar decreases of off-current with increasing drive current for both transistor gate lengths, with lower gate angle transistors generally having lower leakage current. Viewing these data as a whole, it is determined that as the gate angle increases from 0° to 20°, the drive current increases about 0.3 a.u., the threshold voltage decreases about 0.05 a.u., and the off-current increases about 0.4 decades. Furthermore, there is more than a 20% improvement of Ids-Ioff relative to an analogous baseline transistor having a 20° but only a single pocket implant and a single GDL control implant with no offset. Typically, Idrive is increased with additional low voltage transistor ($LV_T$) masks on selected transistors to increase the performance. Disclosed aspects accomplish the same performance improvement without adding the needed extra masks and thus save the associated process cost in implementing the extra masks.

Disclosed aspects can be used to form semiconductor die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this Disclosure relates will appreciate that many other aspects are possible within the scope of the claimed invention, and further additions, deletions, substitutions and modifications may be made to the described aspects without departing from the scope of this Disclosure.

The invention claimed is:

1. An integrated circuit (IC), comprising:
   a substrate having a first active area and a second active area both with a second conductivity type;
   a first source region and a first drain region, and corresponding first and second lightly doped drain (LDD) extensions to the first source region and the first drain region in the first active area, the first and second LDD extensions having a first conductivity type;
   a second source region and a second drain region, and corresponding third and fourth LDD extensions to the second source region and the second drain region in the second active area, the third and fourth LDD extensions having the first conductivity type;
   a first bent-gate transistor comprising a first gate electrode over the first active area extending over the LDD extension, the first gate electrode including an angled portion that crosses an edge of the first active area at an angle of 45° to 80°;
   a second transistor comprising a second gate electrode over the second active area extending over the second LDD extensions;
   a first pocket distribution of the second conductivity type providing a pocket region at least in part under the first gate electrode,
   wherein a threshold voltage of the first bent-gate transistor is at least 30 mV lower as compared to the second transistor, and
   a retrograde gate edge diode leakage (GDL) reduction region of the first conductivity type within the pocket region and between the LDD extension and the first active area, the retrograde GDL reduction region including a dopant of the first conductivity type and a dopant of the second conductivity type.

2. The IC of claim 1, wherein the first bent-gate transistor and the second transistor are configured together to implement an inverter.

3. The IC of claim 1, wherein the second transistor comprises a Manhattan geometry gate transistor.

4. The IC of claim 3, wherein the IC further comprises a third transistor and a fourth transistor, and wherein the first, the second, the third and the fourth transistors are configured together to implement a NAND gate.

5. The IC of claim 4, wherein at least one of the second transistor, the third transistor, and the fourth transistor comprises a Manhattan geometry gate transistor.

6. The IC of claim 1, wherein the threshold voltage of the first bent-gate transistor is at least 100 mV lower as compared to the second transistor.

7. The IC of claim 1, further comprising dielectric isolation between the first active area and the second active area.

8. The IC of claim 1, wherein the angle is in a range of 60° to 80°.

9. The IC of claim 1, wherein the second gate electrode crosses an edge of the second active area at an angle of about 90°.

10. An integrated circuit (IC), comprising:
a well region having a first conductivity type in a semiconductor substrate, the well region having a side;
a gate electrode over the well region, the gate electrode crossing the side of the well region at an angle of 80° or less with respect to the side;
a doped region extending under the gate electrode and including:
a first portion having the first conductivity type that intersects a top surface of the substrate only under the gate electrode;
a second portion having a second opposite conductivity type that intersects the top surface under the gate electrode and adjacent the gate electrode;
a third portion having the second conductivity type located between the second portion and the well region, the third portion having a lower majority carrier concentration than the second region; and
a fourth portion having the first conductivity type located between the first portion and the well region, the fourth portion having a lower majority carrier concentration than the first portion and the well region.

11. The IC of claim 10, wherein the angle is in a range of 60° to 80°.

12. The IC of claim 10, wherein the well region is a p-type well region of an NMOS transistor, and further comprising a PMOS transistor having an n-type well region, the gate electrode crossing a side of the n-type well region at an angle of 80° or less.

* * * * *